United States Patent
Sun et al.

(10) Patent No.: US 9,911,604 B1
(45) Date of Patent: Mar. 6, 2018

(54) SIDEWALL SPACER PATTERN FORMATION METHOD

(71) Applicant: GLOBALFOUNDRIES INC., Grand Cayman (KY)

(72) Inventors: Lei Sun, Albany, NY (US); Xunyuan Zhang, Albany, NY (US); Ruilong Xie, Schenectady, NY (US); Yulu Chen, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/413,823

(22) Filed: Jan. 24, 2017

(51) Int. Cl.
| | | |
|---|---|---|
| *H01L 21/311* | (2006.01) | |
| *H01L 21/027* | (2006.01) | |
| *H01L 29/66* | (2006.01) | |

(52) U.S. Cl.
CPC .... *H01L 21/0273* (2013.01); *H01L 21/31127* (2013.01); *H01L 29/66553* (2013.01)

(58) Field of Classification Search
USPC .......................................... 438/696
See application file for complete search history.

(56) References Cited

U.S. PATENT DOCUMENTS

| | | | |
|---|---|---|---|
| 7,829,466 B2 | 11/2010 | Johnson et al. | |
| 9,064,901 B1 | 6/2015 | He et al. | |
| 9,224,617 B2 | 12/2015 | Pritchard et al. | |
| 9,368,349 B2 | 6/2016 | Huang et al. | |
| 9,425,097 B1 | 8/2016 | Bouche et al. | |
| 2011/0081618 A1 | 4/2011 | Wang et al. | |
| 2014/0215421 A1 | 7/2014 | Chen et al. | |
| 2014/0273464 A1 | 9/2014 | Shieh et al. | |
| 2016/0079063 A1 | 3/2016 | Lee et al. | |

*Primary Examiner* — Roberts Culbert
(74) *Attorney, Agent, or Firm* — Gibb & Riley, LLC; Yuanmin Cai, Esq.

(57) ABSTRACT

Disclosed are methods of using a lithography-lithography-etch (LLE) technique to form a sidewall spacer pattern for patterning a target layer. In the methods, a photoresist layer is patterned by performing multiple lithographic processes with different photomasks, including a first photomask with a first pattern of parallel bars separated by spaces and a second photomask with a second pattern of opening(s) oriented in an essentially perpendicular direction as compared to the bar(s). The photoresist layer is then developed, creating a third pattern. The third pattern is transferred into a mandrel layer below to form mandrels of different lengths. Then, sidewall spacers are formed on the mandrels and the mandrels are selectively removed to form the sidewall spacer pattern. This sidewall spacer pattern is subsequently used in a sidewall image transfer (SIT) process to pattern a target layer below.

20 Claims, 12 Drawing Sheets

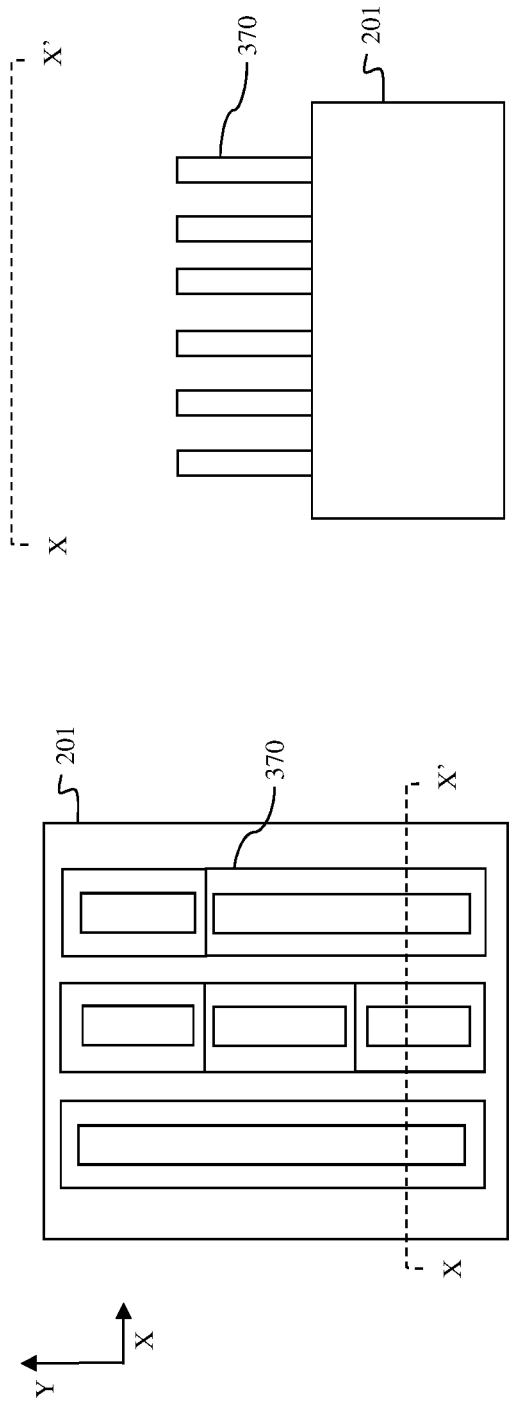

SIDEWALL SPACER PATTERN FORMATION METHOD

FIELD OF THE INVENTION

The present disclosure relates to integrated circuits (ICs) and, more particularly, to methods of forming sidewall spacer pattern for use in patterning features during integrated circuit (IC) fabrication.

BACKGROUND

Sidewall image transfer (SIT) processes are often used during integrated circuit (IC) fabrication to pattern relatively narrow, essentially parallel, rectangular shaped features (e.g., semiconductor fins for fin-type field effect transistors (FINFETs), gate structures for various types of field effect transistors (FETs), metal wires, trenches for metal wires, etc.). SIT processing typically involves the formation of a mandrel layer on a target layer (i.e., on a layer to be patterned), the formation of mandrels (e.g., rectangular shaped bodies) from the mandrel layer using lithographic patterning and etch processes, the formation of sidewall spacers on the mandrels, the selective removal of the mandrels and the cutting of one or more of the sidewall spacers at one or more locations using lithographic patterning and etch processes to form spacer segments of desired lengths. Once the sidewall spacers are cut, thereby completing the formation of a sidewall spacer pattern (i.e., a pattern of sidewall spacers), an etch process can be performed to transfer the image of the sidewall spacer pattern (i.e., the image of the sidewall spacers or remaining segments thereof) into the target layer below.

However, as the size of technology nodes continues to decrease and, more particularly, as the spacer pitch in sidewall spacer patterns continues to decrease so that the density of patterned features within the target layer increases, overlay errors associated with spacer cuts (i.e., associated with the lithographic patterning and etching of spacer cut openings) have more of an impact. Specifically, during the lithographic and etch processes used to form openings that cut through sidewall spacers, overlay errors can occur. When the spacer pitch and the spacer cut length are relatively close in size, an overlay error with respect to a spacer cut opening over a sidewall spacer to be cut can result in, not only an incomplete cut of the sidewall spacer, but also an unwanted cut of an adjacent sidewall spacer. Incomplete sidewall spacer cuts and/or unwanted sidewall spacer cuts can, in turn, result in pattern errors in the pattern that is transferred into the target layer. One technique for avoiding the above-described sidewall spacer cut process involves cutting the mandrel(s) before sidewall spacer formation (referred to as a mandrel cut first technique). However, this mandrel cut first technique is inefficient in terms of time and resources. Therefore, there is a need in the art for an improved method of forming a sidewall spacer pattern.

SUMMARY

In view of the foregoing, disclosed herein are improved methods of forming a sidewall spacer pattern for patterning a target layer. The methods incorporate the use of a lithography-lithography-etch (LLE) technique. Specifically, in the methods, a photoresist layer can be patterned by performing multiple lithographic processes with different photomasks, including a first photomask with a first pattern of parallel bars separated by spaces and a second photomask with a second pattern of opening(s) oriented in an essentially perpendicular direction as compared to the bars. The photoresist layer can then be developed, creating a third pattern. This third pattern can be transferred into a mandrel layer below to form mandrels of different lengths. Sidewall spacers can then be formed on the mandrels and the mandrels can be selectively removed to form the sidewall spacer pattern. Thus, the method provides for the formation of a sidewall spacer pattern without requiring either a discrete mandrel cut process or a discrete sidewall spacer cut process. This sidewall spacer pattern can subsequently be used in a sidewall image transfer (SIT) process to form patterned features (e.g., semiconductor fins, gate stacks, metal wires, trenches for metal wires, etc.) in a target layer below.

Specifically, each of the method embodiments disclosed herein can include the performance of multiple lithographic processes. A first photomask can be used to expose a photoresist layer to light during one of the lithographic processes and a second photomask can be used to expose the photoresist layer to light during another of the lithographic processes. The order in which the photomasks are used can vary. That is, the first photomask could be used followed by the second photomask or vice versa. In any case, the first photomask can have a first pattern of essentially parallel bars separated by spaces and the second photomask can have a second pattern of at least one opening. The first photomask and the second photomask can be oriented during the lithographic processes such that the bars in the first pattern of the first photomask are oriented in a first direction and such that the opening(s) in the second pattern of the second photomask are oriented in a second direction that is essentially perpendicular to the first direction. Thus, following these lithographic processes, the photoresist layer has stripes of essentially parallel unexposed regions separated by exposed regions (created using the first photomask) and further has at least one additional exposed region that divides at least one of the stripes into unexposed segments (created using the second photomask). Following these lithographic processes, the photoresist layer can be developed to remove the exposed regions and the additional exposed region, thereby creating a third pattern in the photoresist layer. The patterned photoresist layer can subsequently be used to create mandrels and sidewall spacers can be formed on the mandrels for creating a sidewall spacer pattern.

More specifically, one particular embodiment of the method disclosed herein can include the performance of multiple lithographic processes (e.g., a first lithographic process and a second lithographic process). During the first lithographic process, a first photomask can be used to expose a photoresist layer to light. The first photomask can have a first pattern of essentially parallel bars separated by spaces so that, following the first lithographic process, the photoresist layer has stripes of essentially parallel unexposed regions separated by exposed regions. During the second lithographic process, a second photomask can be used to expose the photoresist layer to light. The second photomask have a second pattern of openings and can be oriented, during the second lithographic process, such that each opening traverses and is essentially perpendicular to a stripe of an unexposed region and such that, following the second lithographic process, additional exposed region divides the stripe into unexposed segments. In this embodiment of the method, the spaces in the first pattern of the first photomask and the openings in the second pattern of the second photomask can have different widths. Furthermore, the first pattern and the second pattern can have different pitches.

Following these lithographic processes, the photoresist layer can be developed to remove the exposed regions and the additional exposed regions, thereby creating a third pattern in the photoresist layer. The patterned photoresist layer can subsequently be used to create mandrels and sidewall spacers can be formed on the mandrels for creating a sidewall spacer pattern.

Even more specifically, in another particular embodiment of the method, a target layer can be provided. A hardmask layer can be formed on the target layer and a mandrel layer can be formed on the hardmask layer. A photoresist layer can subsequently be formed above the mandrel layer. Next, multiple lithographic processes (e.g., a first lithographic process and a second lithographic process) can be performed. During the first lithographic process, a first photomask can be used to expose the photoresist layer to light. The first photomask can have a first pattern of essentially parallel bars separated by spaces so that, following the first lithographic process, the photoresist layer has stripes of essentially parallel unexposed regions separated by exposed regions. During the second lithographic process, a second photomask can be used to expose the photoresist layer to light. The second photomask have a second pattern of openings and can be oriented, during the second lithographic process, such that each opening traverses and is essentially perpendicular to a stripe of an unexposed region and such that, following the second lithographic process, additional exposed region divides the stripe into unexposed segments. As with the previously described embodiment, the spaces in the first pattern of the first photomask and the openings in the second photomask of the second pattern can have different widths. Furthermore, the first pattern and the second pattern can have different pitches.

Following these lithographic processes, the photoresist layer can be developed to remove the exposed regions and the additional exposed regions, thereby creating a third pattern in the photoresist layer. An etch process can then be performed to transfer the third pattern into the mandrel layer to form mandrels, wherein at least two of the mandrels are in end-to-end alignment and separated by a distance that is approximately equal to the width of the openings. Sidewall spacers can then be formed on the mandrels and, after the sidewall spacers are formed, the mandrels can be selectively removed, thereby forming the sidewall spacer pattern. Once the spacer pattern is formed, multiple etch processes can be performed to transfer the sidewall spacer pattern into the hardmask layer and further into the target layer below.

BRIEF DESCRIPTION OF THE DRAWINGS

The foregoing and other exemplary purposes, aspects and advantages will be better understood from the following detailed description of exemplary embodiments herein with reference to the drawings, which are not necessarily drawn to scale and in which:

FIGS. 10A and 10B are top view and cross-section diagrams, respectively, illustrating a patterned target layer formed according to the flow diagram of FIG. 1.

DETAILED DESCRIPTION

Figure 1:
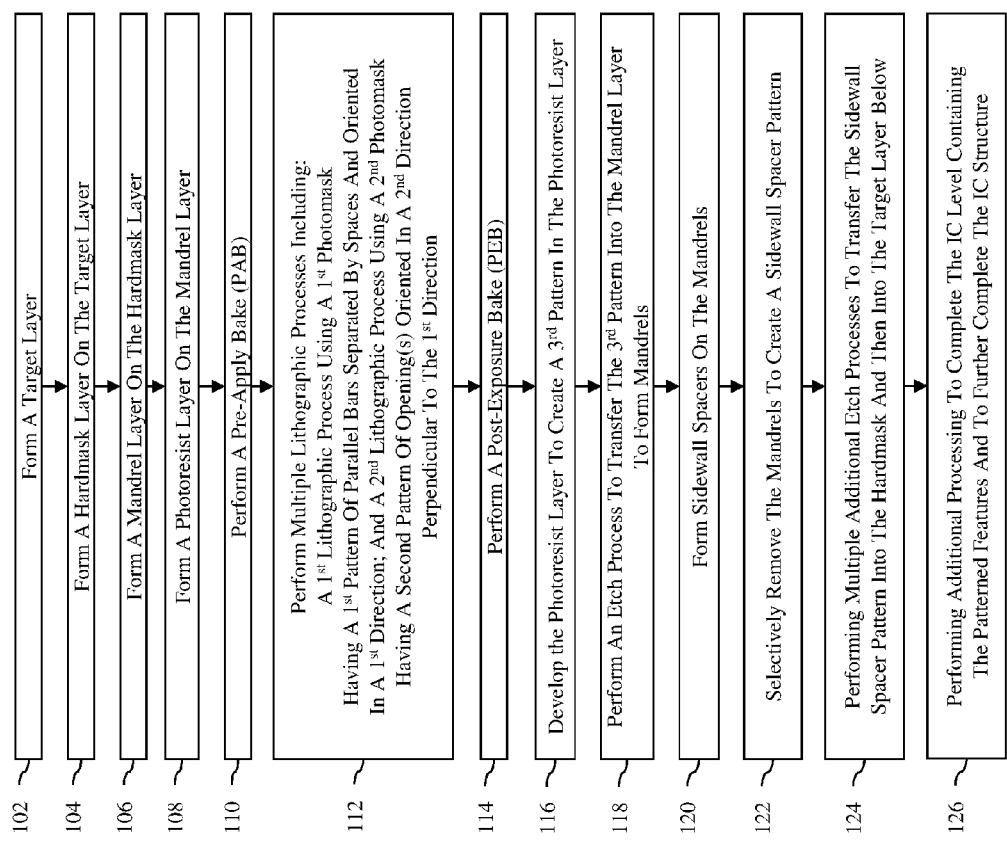
FIG. 1 is a flow diagram illustrating methods of forming and using a sidewall spacer pattern.

As mentioned above, sidewall image transfer (SIT) processes are often used during integrated circuit (IC) fabrication to pattern relatively narrow, essentially parallel, rectangular shaped features (e.g., semiconductor fins for fin-type field effect transistors (FINFETs), gate structures for various types of field effect transistors (FETs), metal wires, trenches for metal wires, etc.). SIT processing typically involves the formation of a mandrel layer on a target layer (i.e., on a layer to be patterned), the formation of mandrels (e.g., rectangular shaped bodies) from the mandrel layer using lithographic patterning and etch processes, the formation of sidewall spacers on the mandrels, the selective removal of the mandrels and the cutting of one or more of the sidewall spacers at one or more locations using lithographic patterning and etch processes to form spacer segments of desired lengths. Once the sidewall spacers are cut, thereby completing the formation of a sidewall spacer pattern (i.e., a pattern of sidewall spacers), an etch process can be performed to transfer the image of the sidewall spacer pattern (i.e., an image of the sidewall spacers or remaining segments thereof) into the target layer below.

However, as the size of technology nodes continues to decrease and, more particularly, as the spacer pitch in sidewall spacer patterns continues to decrease so that the density of patterned features within the target layer increases, overlay errors associated with spacer cuts (i.e., associated with the lithographic patterning and etching of spacer cut openings) have more of an impact. Specifically, during the lithographic and etch processes used to form openings that cut through sidewall spacers, overlay errors can occur. When the spacer pitch and the spacer cut length are relatively close in size, an overlay error with respect to a spacer cut opening over a sidewall spacer to be cut can result, not only in an incomplete cut of the sidewall spacer, but also an unwanted cut of an adjacent sidewall spacer. Incomplete sidewall spacer cuts and/or unwanted sidewall spacer cuts can, in turn, result in pattern errors in the pattern that is transferred into the target layer. One technique for avoiding the above-described sidewall spacer cut process involves cutting the mandrel(s) before sidewall spacer formation (referred to as a mandrel cut first technique). However, this mandrel cut first technique is inefficient in terms of time and resources. Therefore, there is a need in the art for an improved of forming a sidewall spacer pattern.

In view of the foregoing, disclosed herein are improved methods of forming a sidewall spacer pattern for patterning a target layer. The methods incorporate the use of a lithography-lithography-etch (LLE) technique. Specifically, in the methods, a photoresist layer can be patterned by performing multiple lithographic processes with different photomasks, including a first photomask with a first pattern of parallel bars separated by spaces and a second photomask with a second pattern of opening(s) oriented in an essentially perpendicular direction as compared to the bars. The photoresist layer can then be developed, creating a third pattern. This third pattern can be transferred into a mandrel layer below to form mandrels of different lengths, sidewall spacers can be formed on the mandrels and the mandrels can be selectively removed to form the sidewall spacer pattern. Thus, the method provides for the formation of a sidewall spacer pattern without requiring either a discrete mandrel cut process or a discrete sidewall spacer cut process. This sidewall spacer pattern can subsequently be used in a sidewall image transfer (SIT) process to form patterned features (e.g., semiconductor fins, gate stacks, metal wires, trenches for metal wires, etc.) in a target layer below.

More particularly, referring to the flow diagram of FIG. 1, disclosed herein are improved methods of forming a sidewall spacer pattern for patterning a target layer. The method can begin with a target layer 202 to be patterned with relatively narrow, essentially parallel, features (102, see FIG. 2). For example, the target layer 202 can be a gate conductor layer (e.g., a polysilicon layer) to be patterned into relatively narrow, essentially parallel gate structures for field effect transistor(s) (FETs). In this case, the substrate 201 on which the gate structures are formed can be, for example, a top surface of a semiconductor layer (e.g., a silicon layer) of a semiconductor-on-insulator wafer (e.g., silicon-on-insulator (SOI) wafer) or a top surface of a bulk semiconductor substrate (e.g., a bulk silicon substrate). Alternatively, the target layer 202 can be a semiconductor layer (e.g., a silicon layer) to be patterned into relatively narrow, essentially parallel, semiconductor fins for fin-type field effect transistor(s) (FINFETs). In this case, the substrate 201 on which the semiconductor fins are formed can be, for example, a top surface of an insulator layer (e.g., a buried oxide (BOX) layer) of a semiconductor-on-insulator wafer (e.g., silicon-on-insulator (SOI) wafer) or a lower portion of a bulk semiconductor substrate (e.g., a bulk silicon substrate). Alternatively, the target layer 202 can be any other layer that is used in integrated circuit processing that requires patterning into relatively narrow, essentially parallel, features. For example, the target layer 202 can be a metal layer that is to be patterned with metal wires or a back end of the line (BEOL) dielectric layer to be patterned with closely spaced trenches to be filled with metal wires.

Figure 2:
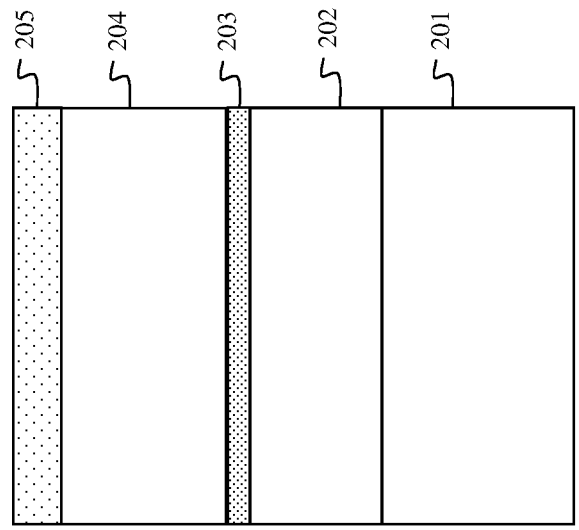
FIG. 2 is a cross-section diagram illustrating a partially completed structure formed according to the flow diagram of FIG. 1.

In any case, a hardmask layer 203 can be formed on the target layer 202 (104, see FIG. 2). The hardmask layer 203 can be, for example, a silicon nitride layer or other suitable hardmask layer. A mandrel layer 204 can be formed on the hardmask layer (106, see FIG. 2). The mandrel layer 204 can be, for example, polysilicon layer or some other suitable mandrel material layer, which as discussed in detail above can be etched selective to the hardmask layer 203 and subsequently formed sidewall spacers (see detailed discussion below regarding steps 122-124).

After the mandrel layer 204 is formed on the hardmask layer 203, a photoresist layer 205 (e.g., a chemically amplified photoresist layer) can be formed above the mandrel layer 204 (108, see FIG. 2). Those skilled in the art will recognize that a photoresist layer is a photosensitive material that, when exposed to light, undergoes a chemical change. This chemical change will make the exposed areas either soluble in a photoresist developer (e.g., in the case of a positive tone photoresist) or insoluble in a photoresist developer (e.g., in the case of a negative tone photoresist). Optionally, prior to formation of the photoresist layer on the mandrel layer a bottom anti-reflective coating (BARC) coating or other organic planarization layers (OPL) could be formed (not shown).

Once the photoresist layer 205 is formed, a post-apply bake (PAB) process can be performed (e.g., to remove excess solvent within the photoresist layer and, particularly, to dry the photoresist layer 205) (110). Such a PAB process is well known in the art and, thus, the details of this process have been omitted from this specification in order to allow the reader to focus on the salient aspects of the disclosed methods.

Next, multiple lithographic processes (e.g., a first lithographic process and a second lithographic process) can be performed using two different photomasks (also referred to herein as reticles or photoreticles) having two different patterns (112). The lithographic processes can be conventional lithographic processes or extreme ultraviolet (EUV) lithographic processes. Those skilled in the art will recognize that both conventional and EUV lithographic processes are performed using a photomask. Specifically, in conventional lithography, the photomask typically incorporates a light-transmissive layer (e.g., a glass layer) and a patterned light-blocking layer (e.g., a patterned chromium layer) on the light-transmissive layer. The photomask is positioned between a light source and a photoresist layer and light from the light source is directed through the photomask toward a photoresist layer. Specifically, the light is transmitted through light-transmissive areas of the photomask to the photoresist layer and blocked by the light-blocking areas of the photomask, thereby creating a corresponding pattern of exposed and unexposed regions on the photoresist layer. In extreme ultraviolet (EUV) lithography, the photomask typically incorporates light-reflective layer(s) and a patterned light-absorbing layer on the light-reflective layer(s). The photomask is positioned to reflect light from a light source off of the photomask and toward a photoresist layer. Specifically, the light is reflected off of the light-reflective areas of the photomask toward the photoresist layer and absorbed by the light-absorbing areas of the photomask, thereby creating a corresponding pattern of exposed and unexposed regions on the photoresist layer.

Figures 3A, 3B:
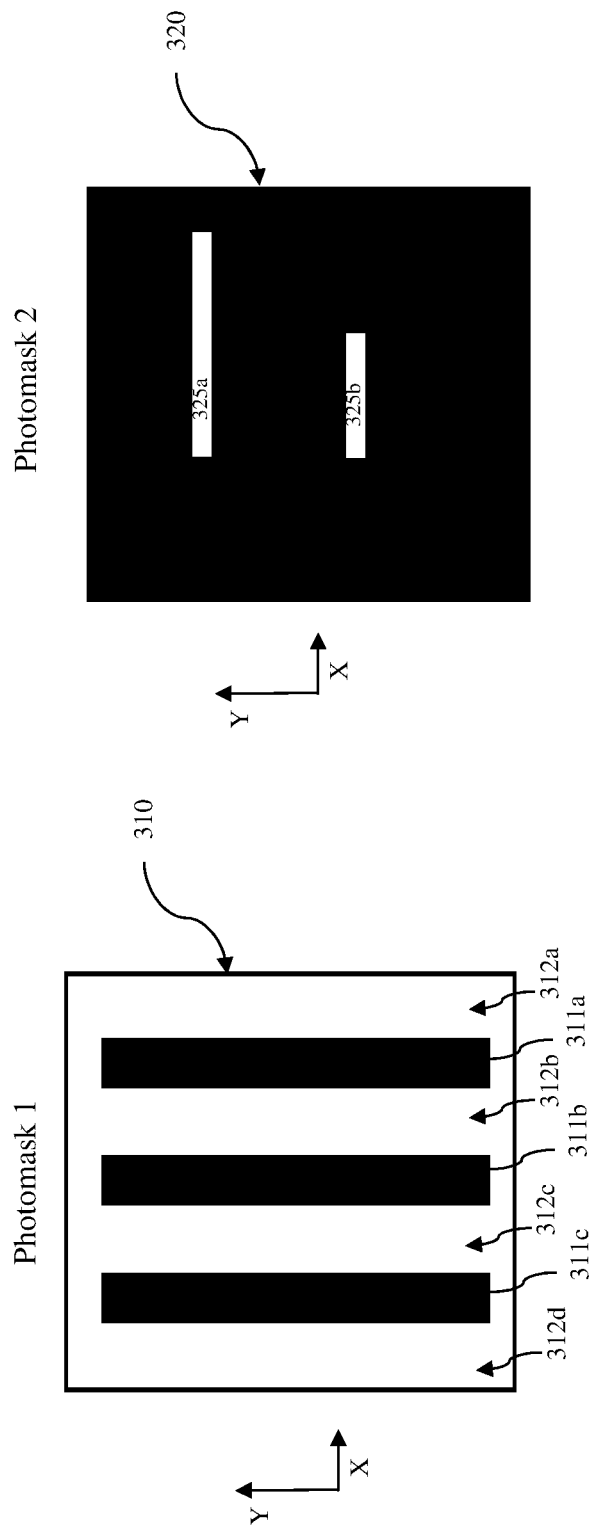
FIGS. 3A and 3B are diagrams illustrating exemplary photomasks that can be used during the first and second lithographic processes described at step 112 of the flow diagram of FIG. 1.

In the methods disclosed herein a first photomask can be used during a first lithographic process and a second photomask that is different from the first photomask can be used in the second lithographic process. FIGS. 3A and 3B are drawings illustrating an exemplary first photomask and an exemplary second photomask, respectively.

The first photomask can, as illustrated in FIG. 3A, have a first pattern 310 of essentially parallel bars 311a-c separated by and positioned laterally between spaces 312a-d. Specifically, for conventional lithography, the patterned light-blocking layer of the first photomask can have essentially parallel bars (i.e., elongated parallel rectangular-shaped light-blocking areas, such as chromium bars) that are positioned laterally between and are separated by spaces or, more particularly, by light-transmissive areas. For EUV lithography, the patterned light-absorbing layer of the first photomask can have essentially parallel bars (i.e., elongated parallel rectangular-shaped light-absorbing areas) that are positioned laterally between and are separated by spaces or, more particularly, by light-reflective areas. For purposes of illustration, the first pattern 310 of the first photomask is shown as having bars. However, it should be understood that FIG. 3A is not intended to be limiting and that this first pattern 310 can have any number of one or more bars or other elongated patterned shapes.

The second photomask can, as illustrated in FIG. 3B, have a second pattern 320 of openings (e.g., see openings 325a-b). Specifically, for conventional lithography, the patterned light-blocking layer of the second photomask can have openings 325a-b that extend there through to the light-transmissive layer such that the openings 325a-b are light-transmissive areas surrounded by light-blocking areas. For EUV lithography, the patterned light-absorbing layer of the second photomask can have openings 325a-b that extend there through to the light-reflective layer(s) such that the openings 325a-b are light-reflective areas surrounded by light-absorbing areas. Each opening can, for example, be essentially rectangular in shape. The openings can be the same or different sizes. For purposes of illustration, the second pattern 320 of the second photomask is shown as having two openings with different sizes (as discussed in greater detail below). However, it should be understood that FIG. 3B is not intended to be limiting and that this second pattern can have any number of one or more openings of the same or different sizes.

In any case, the openings 325a-b in the second pattern 320 can have different dimensions as compared to the bars 311a-c and the spaces 312a-d in the first pattern 310. Specifically, the area dimension of each opening 325a-b in the second pattern 320 can be different from and, particularly, smaller than the area dimensions of each bar 311a-c and each space 312a-d in the first pattern 310. Additionally, the openings 325a-b in the second pattern 320 of the second photomask and the bars 311a-c in the first pattern 310 of the first photomask can have different pitches. Specifically, the distance between the center point of adjacent openings 325a-b in the second pattern 320 can be different from and, particularly, larger than the distance between the center point of adjacent bars 311a-c in the first pattern 310. For example, the width of the openings 325a-b in the second pattern 320 as measured in the Y-direction can be equal to or less than the width of the bars 311a-c in the first pattern 310 as measured in the X-direction and, optionally, equal to or less than the width of the spaces 312b-c between the bars 311a-c also as measured in the X-direction. The length of the openings 325a-b in the second pattern 320 as measured in the X-direction can be at least equal to the width of a single bar 311a-c. In exemplary embodiments, the first pattern 310 can have bars 311a-c with a width of 10-110 nm as measured in the X-direction and a first pitch of 15-1000 nm and the second pattern 320 can have openings 325a-b with a width of 10-100 nm as measured in the Y-direction (but still less than the width of bars 311a-c as measured in the X-direction) and a second pitch of 20-1100 nm (but still greater than the first pitch). In preferred embodiments, the first pattern 310 can have bars 311a-c with a width of 50-70 nm as measured in the X-direction and a first pitch of 100 nm or less and the second pattern 320 can have openings 325a-b with a width of 15-60 nm in the Y-direction (but still less than the width of the bars 311a-c as measured in the X-direction) and a second pitch that is greater than the first pitch.

In any case, the first pattern 310 of the first photomask and the second pattern 320 of the second photomask should be designed so that, if the first photomask and second photomask were stacked (i.e., overlaid) one on top of the other, the bar(s) (e.g., 311a-c) of the first pattern would be oriented in a first direction (e.g., the Y-direction, as illustrated) and the opening(s) (e.g., 325a-b) of the second pattern 320 would be oriented in a second direction that is essentially perpendicular to the first direction (e.g., the X-direction, as illustrated) such that each of the one or more opening(s) (e.g., 325a-b) in the second pattern 320 traverse one or more of the bar(s) (e.g., 311a-c) in the first pattern 310. For example, in the exemplary photomasks shown in FIGS. 3A and 3B, the different sized openings 325a and 325b of the second pattern 320 would each traverse the center bar 311b of the first pattern 310 and the opening 325a would further traverse the right bar 311a.

The first photomask and the second photomask can be similarly oriented during the first lithographic process and the second lithographic process, respectively, such that the bar(s) (e.g., 311a-c) in the first pattern 310 of the first photomask will be oriented in the first direction (e.g., the Y-direction) and such that the opening(s) (e.g., 325a-b) in the second pattern 320 of the second photomask will be oriented in the second direction that is essentially perpendicular to the first direction (e.g., the X-direction).

Following the combination of these lithographic processes, the photoresist layer 205 will have stripes of essentially parallel unexposed regions separated by exposed regions (created using the first photomask) and will further have at least one additional exposed region that divides at least one of the stripes into unexposed segments (created using the second photomask). For purposes of illustration, the multiple lithographic processes 112 are described in greater detail below and illustrated in the drawings in the following sequence: the first lithographic process performed using the first photomask followed by the second lithographic process performed using the second photomask. However, it should be understood that this sequence is not a condition of the method and, alternatively, the multiple lithographic processes could be performed in the following sequences: the second lithographic process using the second photomask followed by the first lithographic process performed using the first photomask.

Figure 4:
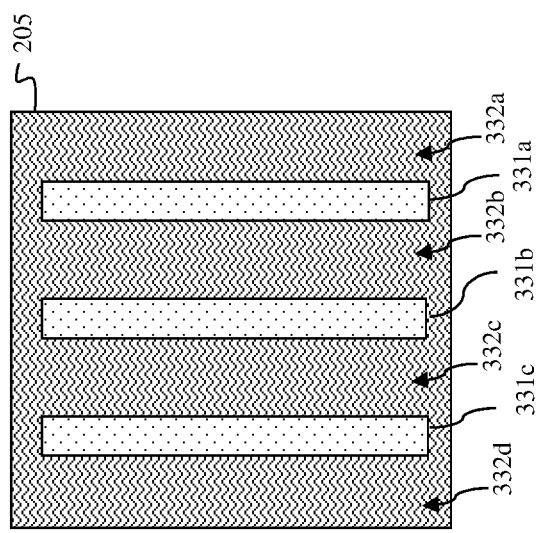
FIG. 4 is a top view diagram illustrating a partially completed structure formed according to the flow diagram of FIG. 1.
Figure 5:
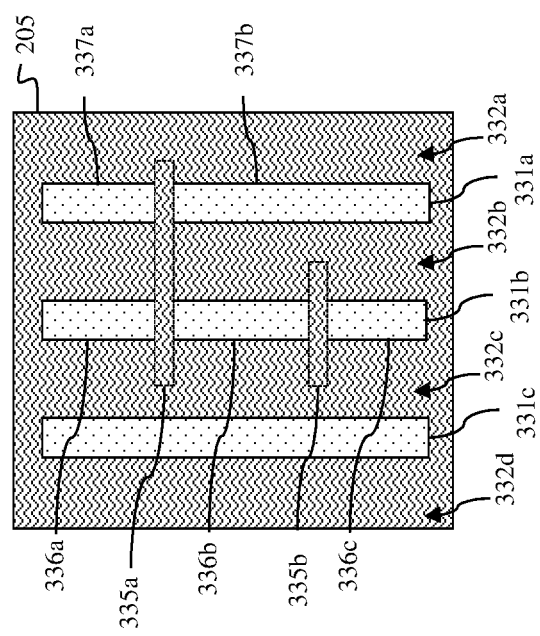
FIG. 5 is a top view diagram illustrating a partially completed structure formed according to the flow diagram of FIG. 1.

During the first lithographic process using the first photomask (e.g., as shown in FIG. 3A), light from a light source can be transmitted through the first pattern 310 in the case of conventional lithography (or reflected off of the first pattern 310 in the case of EUV lithography) in order to create, within the photoresist layer 205, stripes of essentially parallel unexposed regions 331a-c separated by and positioned laterally between exposed regions 332a-d (see FIG. 4). During the second lithographic process using the second photomask (e.g., as shown in FIG. 3B), light from the light source can be transmitted through the second pattern 320 in the case of conventional lithography (or reflected off of the second pattern 320 in the case of EUV lithography). In any case, given the different orientations and placements of the bars 311a-c of the first pattern 310 and the openings 325a-b of the second pattern 320, when the second lithographic process follows the first, each opening 325a-b in the second pattern will traverse and be essentially perpendicular to one or more stripes of an unexposed region in the photoresist layer 205. Thus, following the second lithographic process, additional exposed regions will divide those stripe(s) into unexposed segments. For example, see the photoresist layer 205 of FIG. 5 with unexposed regions 331a-c separated by and positioned laterally between exposed regions 332a-d. Due to the combination of opening 325a, which traverses the stripes of unexposed regions 331a and 331b, and opening 325b, which traverses only the stripe of unexposed region 331b, the stripe of unexposed region 331a is divided by a single additional exposed region 335a into two unexposed segments 337a-b and the stripe of unexposed region 331b is divided by two additional exposed regions 335a-b into three unexposed segments 336a-c.

The multiple lithographic processes described above (i.e., the first lithographic process and the second lithographic process) can be performed in a single chamber, in sequence. That is, one lithographic process can be performed in the chamber, the photomasks can be changed and the other lithographic process can be performed immediately thereafter. No removal of the wafer from the processing chamber is required between the lithographic processes and no additional processing of the wafer is required between the lithographic processes. Additionally, it should be noted that the same lithographic processing specifications (including, but not limited to, specifications for exposure energy, exposure wavelength and lens aperture) could be used for exposing the photoresist layer during each of the lithographic processes. Alternatively, different lithographic processing specifications could be used and these processing specifications could be tailored to achieve exposed and unexposed regions with desired dimensions giving the different patterns used in the different photomasks.

Following the lithographic processes, a post-exposure bake (PEB) process can be performed to provide for photogenerated acid diffusion (114). Such a PEB process is well known in the art and, thus, the details of this process have been omitted from this specification in order to allow the reader to focus on the salient aspects of the disclosed methods.

Those skilled in the art will recognize that in chemically amplified photoresists a PEB process catalytically completes the photoreaction that was initiated during the lithographic process due to light exposure. Specifically, this PEB promotes the thermally activated diffusion of acid, which has been formed in a spatial periodic pattern in the exposed regions during the lithographic process and which would otherwise negatively impact the development of the photoresist layer at process 116 (discussed in greater detail below) by limiting the contrast between the unexposed and the exposed regions. It should be noted that prior attempts at using multiple lithographic processes to pattern a photoresist layer prior to any development (e.g., in order to allow for pitch scaling) have been found to be unfeasible because diffusion of acid from exposed regions in the photoresist layer during PAB result in a surplus of acid diffusing into the unexposed region positioned laterally between two exposed regions. That is, diffusion of acid into the unexposed region from the adjacent exposed regions on either side resulted, not in leveling out of the acid concentration through the photoresist layer, but rather a relatively high concentration of acid within the unexposed region. This surplus of acid, like the spatial periodic pattern of acid discussed earlier, negatively impacted development of the photoresist layer by severely limiting the contrast between the unexposed and the exposed regions. Thus, additional processing being of the wafer between the first lithographic process and the second lithographic process is generally required. That is, a litho-etch-litho-etch (LELE) technique (e.g., wherein a first lithographic process is performed followed by development and then the second lithographic process is performed followed by development) or a litho-freeze-litho-etch (LFLE) technique (e.g., wherein the first lithographic process is performed, the pattern is frozen and, particularly, coated with an additional photoresist layer and then the second lithographic process is performed followed by development) is required.

However, in the methods disclosed herein the combination of patterns in the first and second photomasks, as described in detail above, minimizes the risk of a surplus of acid diffusing into the unexposed regions 331a-c (including the discrete unexposed segments 336a-c of region 331b). That is, because the openings 325a-b in the second pattern 320 are oriented perpendicular to the bars 311a-c in the first pattern 310, because the openings 325a-b in the second pattern 320 are relatively small in dimension as compared to the bars 311a-c and spaces 312a-d in the first pattern 310 and because the openings 325a-b in the second pattern 320 preferably have a relatively large pitch as compared to the bars 311a-c in the first pattern 310, the inventors of the present invention have found that acid diffusion from the additional exposed regions 335a-b created using the second photomask will be minimal such that there will be minimal acid diffusion overlap, which would otherwise significantly negatively impact photoresist layer development. Thus, the combination of patterns in the first and second photomasks allow for the use of a litho-litho-etch (LLE) technique, wherein no freeze or development processes are required between the first and second lithographic processes.

Figure 6:
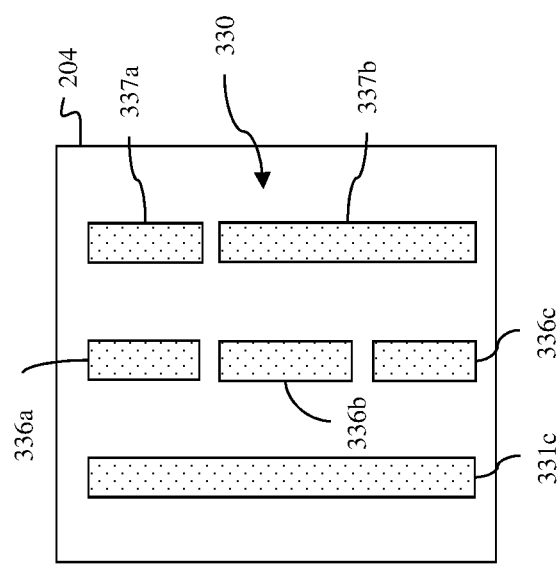
FIG. 6 is a top view diagram illustrating a partially completed structure formed according to the flow diagram of FIG. 1.

Following the lithographic processes, the photoresist layer 205 can be developed to remove the exposed regions 332a-d and the additional exposed regions 335a-b, thereby creating a third pattern 330 in the photoresist layer 205 (116, see FIG. 6). Specifically, the surface of the photoresist layer 205 can be treated with a photoresist developer in order to dissolve the exposed regions 332a-d and the additional exposed regions 335a-b. Various photoresist development techniques are well known in the art and, thus, the details of these techniques have been omitted from this specification in order to allow the reader to focus on the salient aspects of the disclosed methods.

Figure 7B:
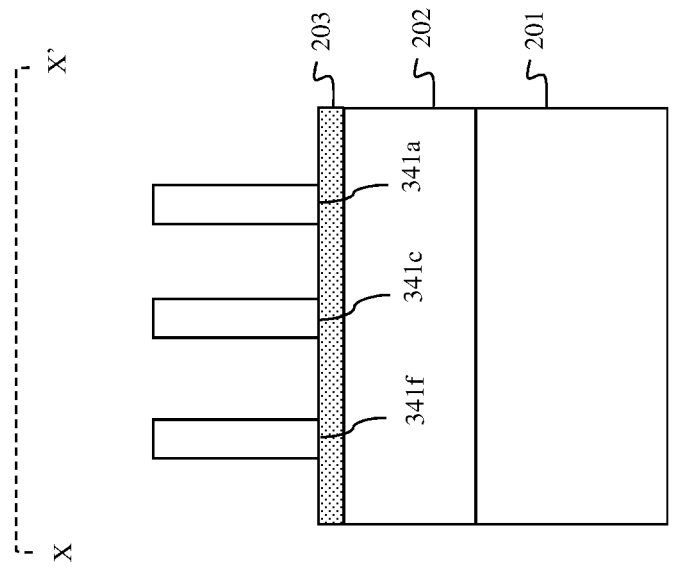
FIGS. 7A and 7B are top view and cross-section diagrams, respectively, illustrating a partially completed structure formed according to the flow diagram of FIG. 1.
Figure 7A:
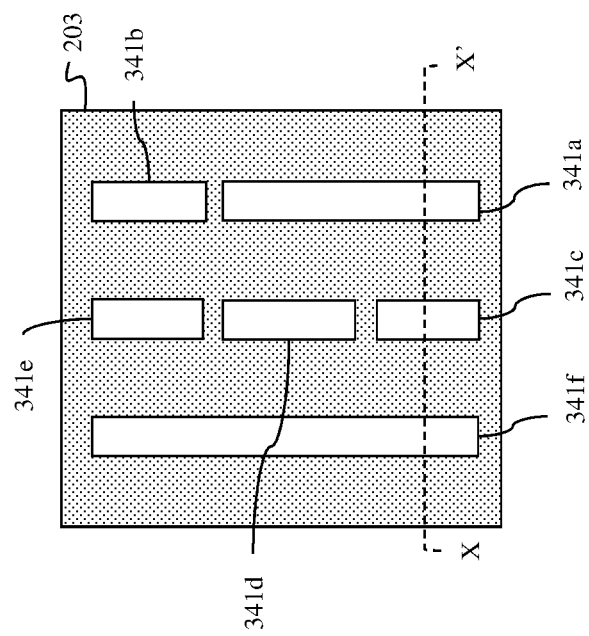

A selective anisotropic etch process can then be performed to transfer the third pattern 330 into the mandrel layer 204 (118, see FIGS. 7A-7B). Specifically, using the third pattern as a mask, an anisotropic etch process can be used to selectively etch the mandrel material stopping on the hardmask layer 203, thereby forming mandrels 341a-f corresponding to the remaining unexposed areas of the photoresist layer 205. For purposes of this disclosure, a mandrel is an essentially rectangular-shaped body. Since the mandrels 341a-f correspond to the unexposed areas of the photoresist layer 205, at least some of the mandrels will be in end-to-end alignment, separated by a predetermined distance and shorter than other mandrels. For example, as illustrated in FIG. 7A, the mandrels 341a-b, which correspond to the unexposed segments 337a-b of the unexposed region 331a, are in end-to-end alignment, separated by a predetermined distance and shorter than the mandrel 341f, which corresponds to the full-length unexposed region 331c. Similarly, the mandrels 341c-e, which correspond to the unexposed segments 336a-c, are in end-to-end alignment, separated by a predetermined distance and shorter than the mandrel 341f and 341a. It should be noted that the predetermined distance that separates mandrels that are in end-to-end alignment can be approximately equal to the width of the openings 325a-b in the second pattern 320 of the second photomask with some variations being dependent upon the lithographic process specifications uses.

Figure 8B:
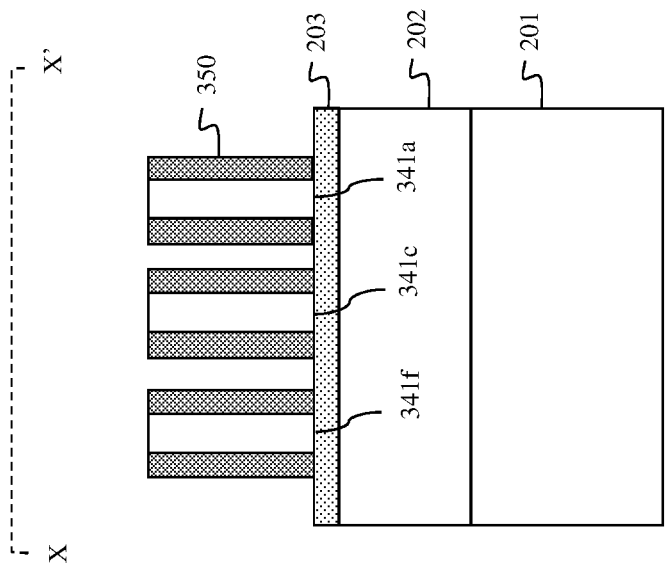
FIGS. 8A and 8B are top view and cross-section diagrams, respectively, illustrating a partially completed structure formed according to the flow diagram of FIG. 1.
Figure 8A:
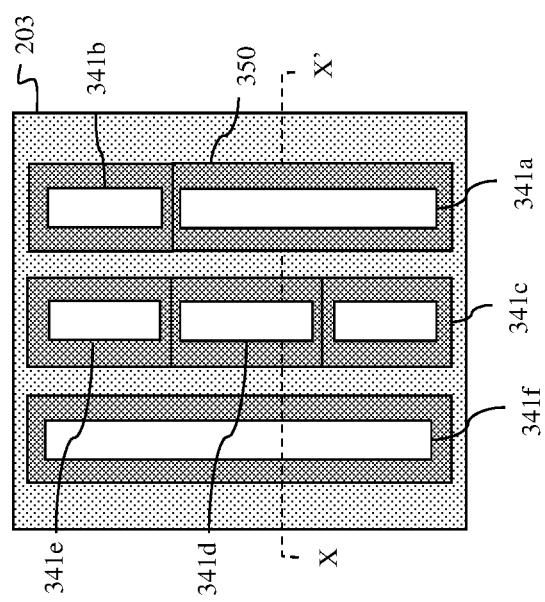

Sidewall spacers 350 can then be formed on and, particularly, positioned laterally immediately adjacent to vertical sidewalls of the mandrels 341a-f so as to laterally surround the mandrels 341a-f (120, see FIGS. 8A-8B). To form the sidewall spacers 350, a dielectric layer can be conformally deposited (e.g., by chemical vapor deposition (CVD) or another suitable deposition method) over the mandrels 341a-f and onto the exposed surfaces of the hardmask layer 203 adjacent to the mandrels 341a-f. This dielectric layer can be made of a different material than the hardmask layer 203 and the mandrels 341a-f. For example, the dielectric layer can be made of silicon oxide, silicon oxynitride, etc.). Next, an anisotropic etch process can be performed in order to remove the horizontal portions of the dielectric layer from the top surfaces of the mandrels 341a-f and from the hardmask layer 203 between the mandrels 341a-f, thereby exposing the top surfaces of the mandrels 341a-f and portions of the hardmask layer 203 between the mandrels 341a-f.

Figure 9B:
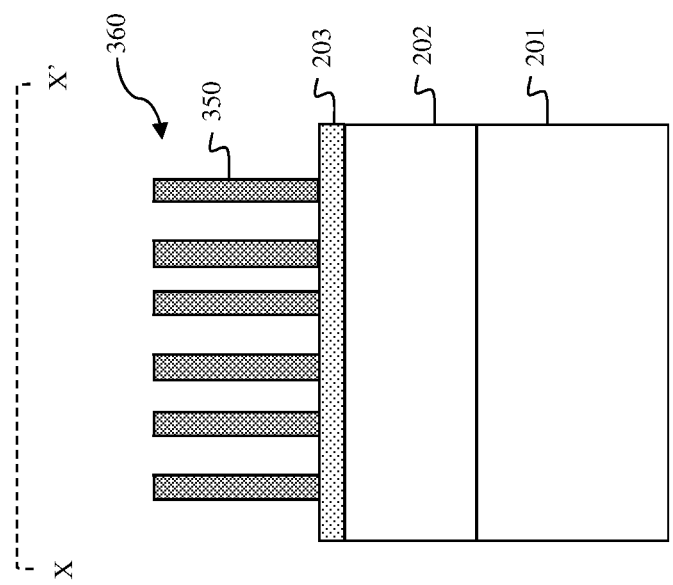
FIGS. 9A and 9B are top view and cross-section diagrams, respectively, illustrating a partially completed structure formed according to the flow diagram of FIG. 1.
Figure 9A:
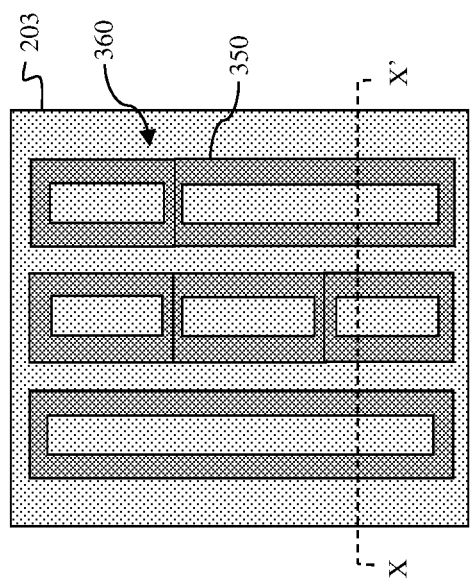

After the sidewall spacers 350 are formed, the mandrels 341a-f can be selectively removed, thereby creating a sidewall spacer pattern 360 (i.e., a pattern of sidewall spacers) on the hardmask layer 203 (122, see FIGS. 9A-9B). As mentioned above, the materials of the mandrels, the sidewall spacers and the hardmask layer are all different (e.g., polysilicon, silicon oxide and silicon nitride, respectively, and, thus, the mandrels 341a-f can be selectively etched over the sidewall spacers 350 and hardmask layer 203. Techniques for selectively etching one material over others (e.g., polysilicon over silicon oxide and/or silicon nitride) are well known in the art and, thus, the details of these techniques are omitted from this specification in order to allow the reader to focus on the salient aspects of the disclosed methods.

Once the sidewall spacer pattern 360 is formed, multiple anisotropic etch processes can be performed to transfer the sidewall spacer pattern 360 (i.e., the image of the sidewalls spacers) into the hardmask layer 203 and further into the target layer 202 below (124, see FIGS. 10A-10B). Thus, the target layer 202 is patterned with relatively narrow, essentially parallel, rectangular shaped features 370. Next, additional processing can be performed to complete the integrated circuit (IC) level containing the features 370 and to further complete the IC structure (126).

For example, if the features 370 are components of semiconductor devices in a device level of the IC structure (e.g., semiconductor fins for fin-type field effect transistors (FINFETs) in the case of a monocrystalline semiconductor target layer (e.g., a silicon target layer) or polysilicon gate structures for various types of field effect transistors (FETs)). additional processing can be performed to complete the semiconductor devices at process 126.

It should be noted that the features 370 shown in FIG. 10A are actually continuous features corresponding to the sidewall spacers 350 previously formed on the mandrels 341a-e. That is, each patterned feature has essentially parallel, rectangular shaped side portions oriented in the Y-direction and end portions oriented in the X-direction. Those skilled in the art will recognize that process steps can be performed before the sidewall spacer pattern 360 is transferred into the target layer 202 so that the end portions are not transferred. Alternatively, process steps can be performed after the sidewall spacer pattern 360 is transferred into the target layer 202 to remove those end portions. Whether performed before or after the sidewall spacer pattern is transferred into the target layer 202, when the features 370 are semiconductor device components these process steps are typically performed prior to any additional processing being performed to complete the semiconductor devices at process 126.

Figure 11B:
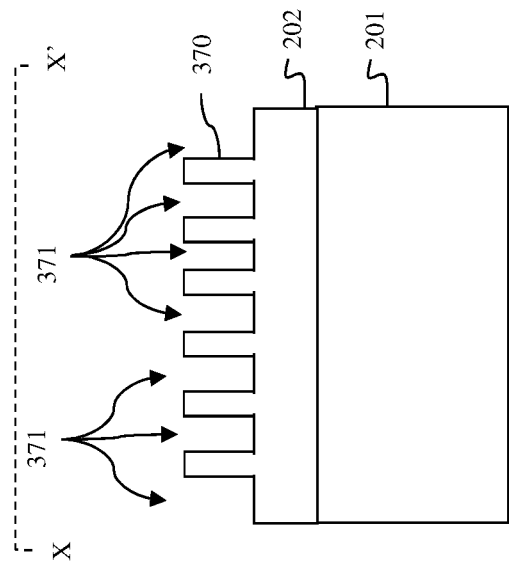
FIGS. 11A and 11B are top view and cross-section diagrams, respectively, illustrating a different patterned target layer, including trenches, formed according to the flow diagram of FIG. 1.
Figure 11A:
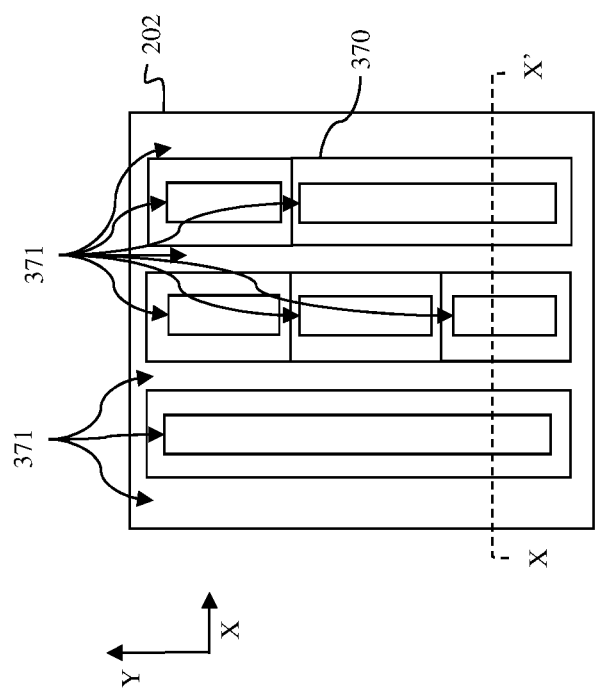
Figures 12A, 12B:
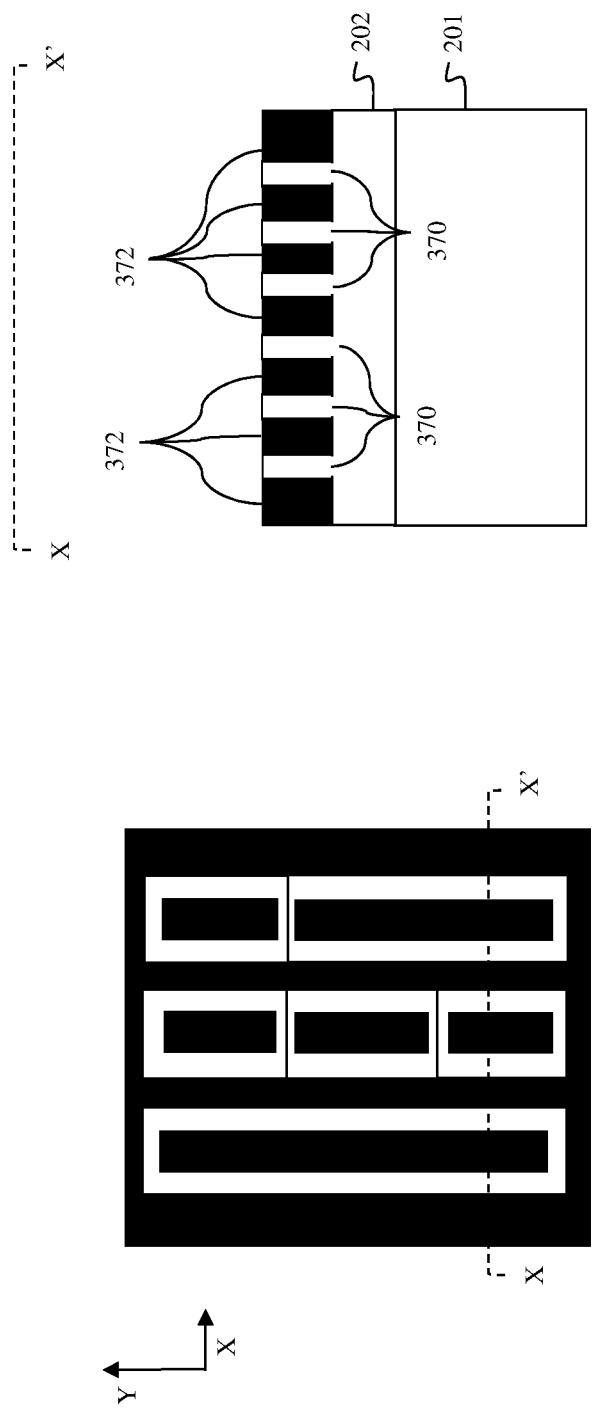
FIGS. 12A and 12B are top view and cross-section diagrams, respectively, illustrating the trenches of FIGS. 11A and 11B filled with metal wires.

In another example, if the target layer 202 is a back end of the line (BEOL) dielectric layer, the sidewall spacer pattern 360 can be transferred into the target layer 202 at process 124 so that only the upper portion of the target layer 202 is patterned with the features 370, thereby forming closely spaced trenches 371 in the upper portion of the target layer 202 (see FIGS. 11A-11B). In this case, metallization can be performed at process 126 to fill the trenches 371 with metal wires 372 such that the metal wires 372 are electrically isolated from each other by the features 370 within the BEOL dielectric layer (see FIGS. 12A-12B).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). As used herein, the phrase "positioned laterally" refers to an element be positioned to one side of another element as opposed to above or below the other element as they are oriented in the drawings. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are improved methods of forming a sidewall spacer pattern for patterning a target layer. The methods incorporate the use of a lithography-lithography-etch (LLE) technique. Specifically, in the methods, a photoresist layer can be patterned by performing multiple lithographic processes with different photomasks, including a first photomask with a first pattern of parallel bars separated by spaces and a second photomask with a second pattern of opening(s) oriented in an essentially perpendicular direction as compared to the bars. The photoresist layer can then be developed, creating a third pattern. This third pattern can be transferred into a mandrel layer below to form mandrels of different lengths, sidewall spacers can be formed on the mandrels and the mandrels can be selectively removed to form the sidewall spacer pattern. Thus, the method provides for the formation of a sidewall spacer pattern without requiring either a discrete mandrel cut process or a discrete sidewall spacer cut process. This sidewall spacer pattern can subsequently be used in a sidewall image transfer (SIT) process to form patterned features (e.g., semiconductor fins, gate stacks, metal wires, trenches for metal wires, etc.) in a target layer below.

What is claimed is:

1. A method comprising:
performing multiple lithographic processes to a photoresist layer, the lithographic processes being performed in sequence using at least two different photomasks having two different patterns in order to expose the photoresist layer to light such that, following the lithographic processes, the photoresist layer has stripes of essentially parallel unexposed regions separated by exposed regions and further has at least one additional exposed region that is perpendicular to at least one stripe and divides the stripe into unexposed segments; and,
after the performing of the multiple lithographic processes, developing the photoresist layer to remove the exposed regions and the additional exposed region, creating a third pattern in the photoresist layer.

2. The method according to claim 1, the photoresist layer being above a mandrel layer, the mandrel layer being above a hardmask layer and the hardmask layer being above a target layer and the method further comprising:
after the developing of the photoresist layer, performing an etch process to transfer the third pattern into the mandrel layer to form mandrels, wherein at least two of the mandrels are in end-to-end alignment and separated by a predetermined distance;
forming sidewall spacers on the mandrels;
after the forming of the sidewall spacers, selectively removing the mandrels to form a sidewall spacer pattern; and
performing multiple etch processes to transfer the sidewall spacer pattern into the hardmask layer and further into the target layer below.

3. The method according to claim 1, the multiple lithographic processes are performed, in sequence, in a single chamber.

4. The method according to claim 1,
the different photomasks comprising a first photomask having a first pattern of essentially parallel bars separated by spaces and a second photomask having a second pattern of at least one opening,
the first photomask and the second photomask being oriented during the lithographic processes such that, following the lithographic processes, the photoresist layer has the stripes of the essentially parallel unexposed regions separated by the exposed regions and further has the at least one additional exposed region, and,
wherein each space in the first pattern and each opening in the second pattern have different widths and wherein the first pattern of the first photomask and the second pattern of the second photomask having different pitches.

5. The method according to claim 4, wherein, due to different orientations of the at least one opening in the first photomask and the stripes in the second photomask, minimal acid diffusion overlap occurs when acid, which is released in the exposed regions and the at least one additional exposed region during the lithographic processes, diffuses during a post-exposure back (PEB) process.

6. The method according to claim 1, further comprising: before the performing of the lithographic processes, performing a post-apply bake (PAB) process.

7. The method according to claim 1, further comprising: after the performing of the lithographic processes, performing a post-exposure bake (PEB) process.

8. A method comprising:
using a first photomask to expose a photoresist layer to light during a first lithographic process, the first photomask having a first pattern of essentially parallel bars separated by spaces so that, following the first lithographic process, the photoresist layer has stripes of essentially parallel unexposed regions separated by exposed regions;
using a second photomask to expose the photoresist layer to light during a second lithographic process, the second photomask having a second pattern of openings and being oriented, during the second lithographic process, such that each opening traverses and is essentially perpendicular to a stripe of an unexposed region of the photoresist layer and such that, following the second lithographic process, an additional exposed region divides the stripe into unexposed segments, the spaces and the openings having different widths and the first pattern and the second pattern having different pitches; and,
developing the photoresist layer to remove the exposed regions and the additional exposed region, creating a third pattern in the photoresist layer.

9. The method according to claim 8, the photoresist layer being above a mandrel layer, the mandrel layer being above a hardmask layer and the hardmask layer being above a target layer and the method further comprising:
after the developing of the photoresist layer, performing an etch process to transfer the third pattern into the mandrel layer to form multiple mandrels, wherein at least two of the mandrels are in end-to-end alignment and separated by a distance approximately equal to a width of the openings;
forming sidewall spacers on the mandrels;
after the forming of the sidewall spacers, selectively removing the mandrels to form a sidewall spacer pattern; and
performing multiple etch processes to transfer the sidewall spacer pattern into the hardmask layer and further into the target layer below.

10. The method according to claim 8, the first lithographic process and the second lithographic process are performed, in sequence, in a single chamber.

11. The method according to claim 8, wherein the first pattern of the first photomask has a first pitch and the second pattern of the second photomask has a second pitch that is greater than the first pitch.

12. The method according to claim 8, further comprising: before the first lithographic process, performing a post-apply bake (PAB) process.

13. The method according to claim 8, further comprising: after the second lithographic process, performing a post-exposure bake (PEB) process.

14. The method according to claim 13, wherein, due to different orientations of the at least one opening in the first photomask and the stripes in the second photomask, minimal acid diffusion overlap occurs when acid, which is released in the exposed regions during the first lithographic process and which is released in the additional exposed region in the second lithographic process, diffuses during the post-exposure bake (PEB) process.

15. A method comprising:
    providing a target layer;
    forming a hardmask layer on the target layer;
    forming a mandrel layer on the hardmask layer;
    forming a photoresist layer on the mandrel layer;
    using a first photomask to expose the photoresist layer to light during a first lithographic process, the first photomask having a first pattern of essentially parallel bars separated by spaces so that, following the first lithographic process, the photoresist layer has stripes of essentially parallel unexposed regions separated by exposed regions;
    using a second photomask to expose the photoresist layer to light during a second lithographic process, the second photomask having a second pattern of openings and being oriented, during the second lithographic process, such that each opening traverses and is essentially perpendicular to a stripe of an unexposed region and such that, following the second lithographic process, an additional exposed region divides the stripe into unexposed segments, the spaces and the openings having different widths and the first pattern and the second pattern having different pitches;
    developing the photoresist layer to remove the exposed regions and the additional exposed region, creating a third pattern in the photoresist layer;
    performing an etch process to transfer the third pattern into the mandrel layer to form mandrels, wherein at least two of the mandrels are in end-to-end alignment and separated by a distance approximately equal to a width of the openings;
    forming sidewall spacers on the mandrels;
    after the forming of the sidewall spacers, selectively removing the mandrels to form a sidewall spacer pattern; and
    performing multiple etch processes to transfer the sidewall spacer pattern into the hardmask layer and further into the target layer below.

16. The method according to claim 15, the first lithographic process and the second lithographic process are performed, in sequence, in a single chamber.

17. The method according to claim 15, wherein the first pattern of the first photomask has a first pitch and the second pattern of the second photomask has a second pitch that is greater than the first pitch.

18. The method according to claim 15, further comprising:
    before the performing of the first lithographic process, performing a post-apply bake (PAB) process.

19. The method according to claim 15, after the performing the second lithographic process, performing a post-exposure bake (PEB) process.

20. The method according to claim 19, wherein, due to different orientations of the at least one opening in the first photomask and the stripes in the second photomask, minimal acid diffusion overlap occurs when acid, which is released in the exposed regions during the first lithographic process and which is released in the additional exposed region in the second lithographic process, diffuses during the post-exposure bake (PEB) process.

* * * * *